United States Patent [19]

Hsu

[11] Patent Number: 5,627,087
[45] Date of Patent: May 6, 1997

[54] PROCESS FOR FABRICATING METAL-OXIDE SEMICONDUCTOR (MOS) TRANSISTORS BASED ON LIGHTLY DOPED DRAIN (LDD) STRUCTURE

[75] Inventor: Chen-Chung Hsu, Taichung, Taiwan

[73] Assignee: United Microelectronics Corporation, Taiwan

[21] Appl. No.: 612,817

[22] Filed: Mar. 11, 1996

[51] Int. Cl.$^6$ .............................. H01L 21/266
[52] U.S. Cl. .............................. 438/302; 438/305
[58] Field of Search .................. 437/35, 41, 44, 437/157

[56] References Cited

U.S. PATENT DOCUMENTS

| | | | |
|---|---|---|---|
| 5,258,319 | 11/1993 | Inuishi et al. | 437/35 |
| 5,355,006 | 10/1994 | Iguchi | 437/35 |
| 5,476,802 | 12/1995 | Yamazaki et al. | 437/44 |

*Primary Examiner*—Chandra Chaudhari
*Attorney, Agent, or Firm*—Rabin, Champagne & Lynt, P.C.

[57] ABSTRACT

A process for fabricating LDD-based MOS transistors. In the process, an active region is defined by forming a field oxide layer on a substrate. Next, a first gate oxide layer and a first polysilicon layer are formed on the substrate. A lithographic process is used to etch away part of the first gate oxide layer and the first polysilicon layer to expose areas where heavily doped source/drain regions are to be formed. A second polysilicon layer is formed and then ions are implanted to form heavily doped source/drain regions. The second polysilicon layer and the first polysilicon layer are then etched away to form a gate polysilicon layer and expose part of the gate oxide layer proximate to the heavily doped drain. One approach then involves depositing a second oxide layer and performing anisotropic etching on the second oxide layer to form first and second spacers on lateral sides of the gate, and finally implanting ions at slant angle with respect to the substrate into the heavily doped source and drain regions and area below portion of the oxide layer underlying the first spacer. Another approach involves implanting ions at normal angle with respect to the substrate into the heavily doped source/drain regions and area below the exposed portion of the gate oxide layer, thus forming the lightly doped drain.

19 Claims, 3 Drawing Sheets

5,627,087

PROCESS FOR FABRICATING METAL-OXIDE SEMICONDUCTOR (MOS) TRANSISTORS BASED ON LIGHTLY DOPED DRAIN (LDD) STRUCTURE

BACKGROUND OF THE INVENTION

1. Field of the Invention

The invention relates to semiconductor fabrication processes, and more particularly, to a process for fabricating metal-oxide semiconductor (MOS) transistors based on lightly doped drain (LDD) structure.

2. Description of Prior Art

Metal-oxide semiconductor (MOS) transistors are essentially composed of a gate oxide layer, a gate, and an ion-implanted source/drain. A conventional method for increasing the packing density of a MOS transistor IC chip is to shorten the channel in the MOS transistor so as to reduce its feature size. This method, however, can lead to the following two adverse effects: a short channel effect and a hot electrons effect.

The short channel effect arises due to the formation of a depletion layer in the source/drain region during operation of the MOS transistor. The depletion layer overlaps with the channel, thus shortening the effective length of the channel. As a consequence, the subthreshold current is increased due to an increased number of electrons moving from the source through the channel, and the threshold voltage of the MOS transistor is lowered. When the subthreshold is lowered, the gate voltage gradually loses its control of the drain current.

The hot electrons effect arises due to an increase in the transverse electric field intensity across the channel when the channel is shortened, thus allowing the electrons near the drain to gain acceleration to an energy level higher that under thermal equilibrium. These high energy electrons are thus referred to as "hot electrons". The carrier multiplication effect arising due to collisions among these hot electrons causes some of the electrons to damage the gate oxide layer and be trapped in the gate, thereby causing the MOS transistor to deteriorate in performance and reliability. The undesired effect of punchthrough can also arise.

In order to attempt to cope with the aforementioned problems of short channel and hot electron effects, lightly doped drain (LDD) structures have been proposed. In this approach, a region near the channel is doped with a concentration lower than the earlier formed $N^+$ source/drain regions to form a lightly doped $N^-$ region. The provision of the lightly doped $N^-$ region allows a decrease in the transverse electric field intensity, thereby preventing hot electrons from being generated.

FIG. 1 shows a sectional diagram depicting; the structure of the conventional LDD-based MOS transistor, which comprises a silicon substrate 10 on which an active region is defined. Gate oxide layer 11, gate 12, and spacer 14 are then successively formed on the silicon substrate 10. An ion implantation process is performed twice through the spacer 14 so as to form a heavily doped source/drain region 15 and a lightly doped source/drain region 13. The formation of the lightly doped source/drain region 13 thus allows a decrease in the transverse electric field intensity.

One drawback of the aforementioned LDD structure is that, since the source includes a lightly doped $N^-$ region, the resistance thereof is relatively high due to the low concentration of carriers in the lightly doped $N^-$ region. This high resistance causes the series resistance between the drain and the source to be high, thus causing the MOS transistor to deteriorate in performance and to have more electric power dissipation. In other words, the channel current in the source region is inoperable under low voltage.

SUMMARY OF THE INVENTION

It is therefore a primary objective of the invention to provide a process for fabricating an LDD-based MOS transistor using only a single lightly doped region in the drain region. In addition, the process can be performed utilizing a buried contact process, without additional masks, and in conjunction with an SRAM (static random access memory) fabrication process.

Another objective of the invention is to provide a process for fabricating an LDD-based MOS transistor in which hot electrons do not arise due to low ion concentration in the lightly doped region. It will be shown that in order to reduce the hot electrons effect in the drain region, the LDD-based MOS transistor need only be provided with a single lightly doped $N^-$ region. The lightly doped $N^-$ region in the source region is unnecessary and thus can be eliminated.

It is still another objective of the invention to provide a process for fabricating an LDD-based MOS transistor which allows channel current to be operable under low voltage due to low resistance of the source region, by the elimination of any lightly doped region in the source region.

In accordance with the foregoing and other objectives of the invention, there is provided a new and improved process for fabricating LDD-based MOS transistors. Two preferred embodiments of the invention are disclosed. The process according to the first preferred embodiment comprises the steps of: (1) preparing a silicon substrate with a field oxide layer formed thereon to define an active region (2) forming successively a first gate oxide layer and a first polysilicon layer on the silicon substrate; (3) performing lithographic processes to etch away predetermined portions of the first gate oxide layer and the first polysilicon layer so as to expose areas where heavily doped source/drain regions are to be formed; (4) forming a second polysilicon layer and then using the etched first gate oxide layer and the first polysilicon layer as a mask to perform a first ion implantation process to form heavily doped source/drain regions; (5) etching successively the second polysilicon layer and the first polysilicon layer so as to form a gate polysilicon layer and expose part of the gate oxide layer that is proximate to the heavily doped drain; (6) depositing a second oxide layer and then performing an anisotropic etching; process to the second oxide layer so as to form a first spacer and a second spacer on lateral sides of the gate; and (7) performing a second ion implantation process at a slanted angle with respect to the surface of the silicon substrate so as to implant ions respectively into the heavily doped source and drain regions, and an area below the portion of the oxide layer underlying the first spacer.

Further, the process according to the second preferred embodiment comprises the steps of: (1) preparing a silicon substrate formed thereon with a field oxide layer to define an active region; (2) forming successively a first gate oxide layer and a first polysilicon layer on the silicon substrate; (3) performing lithographic processes to etch away predetermined portions of the first gate oxide layer and the first polysilicon layer so as to expose areas where heavily doped source/drain regions are to be formed; (4) forming a second polysilicon layer and then using the etched first gate oxide layer and the first polysilicon layer as a mask to perform a first ion implantation process to form heavily doped source/drain regions; (5) etching successively the second polysilicon layer and the first polysilicon layer so as to form a gate polysilicon layer and expose part of the gate oxide layer that is proximate to the heavily doped drain; and (6) performing a second ion implantation process at approximately a normal angle with respect to the surface of the silicon substrate, while using the exposed portions of the gate oxide layer and the gate polysilicon layer as a mask, to implant a source of ions respectively into the heavily doped source/drain regions and area below the exposed portion of the gate oxide layer, thereby forming a lightly doped drain.

BRIEF DESCRIPTION OF DRAWINGS

The invention can be more fully understood by reading the subsequent detailed description of the preferred embodiments thereof with references made to the accompanying drawings, wherein.

DETAILED DESCRIPTION OF THE PREFERRED EMBODIMENTS

Figure 1:
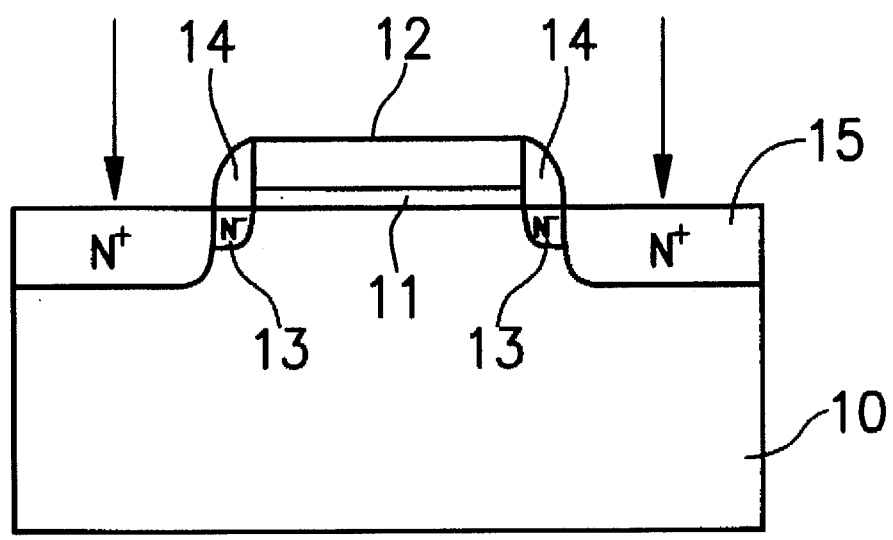
FIG. 1 is a sectional diagram showing a conventional LDD-based MOS transistor.

First Embodiment
1. Defining the active region and forming gate oxide layer and first conductive layer Referring to FIG. 2A, in the first step a silicon substrate 20 is prepared on which field oxide layers 21 are formed so as to define the active region. Next, a gate oxide layer 23 and a first conductive layer 25 are successively formed on the silicon substrate 20. In this embodiment, the silicon substrate 20 is lightly doped with impurities of a first type such as P-type; the field oxide layer 21 is for:med through a conventional method of local oxidation of silicon (LOCOS) so as to define a predetermined area on the silicon substrate 20 as the active region; and the gate oxide layer 23 is formed, through the chemical-vapor deposition (CVD) method or heating, to a thickness of about 50 Å to 300 Å. After that, an ion implantation process is performed to adjust the threshold voltage of the channel.

Figure 2A:
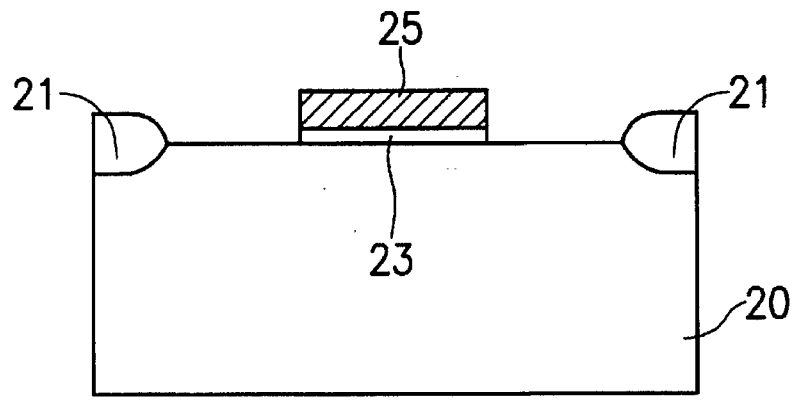
FIGS. 2A–2E are sectional diagrams used to depict the steps involved in a process according to a first embodiment of the invention for fabricating an LDD-based MOS transistor.

Subsequently, a first polysilicon layer is formed as the conductive layer 25 through the low-pressure chemical-vapor deposition (LPCVD) method on the insulation layer 23 to a thickness of 500 Å to 1500 Å. The first polysilicon layer 25 is doped with impurities so as to increase the conductivity thereof. After that, a lithographic process is performed to selectively remove part of the insulation layer 23 and the first polysilicon layer 25 so as to expose the areas where a heavily doped source/drain region is to be formed, as shown in FIG. 2A.

2. Forming gate and heavily doped source/drain region

Figure 2B:
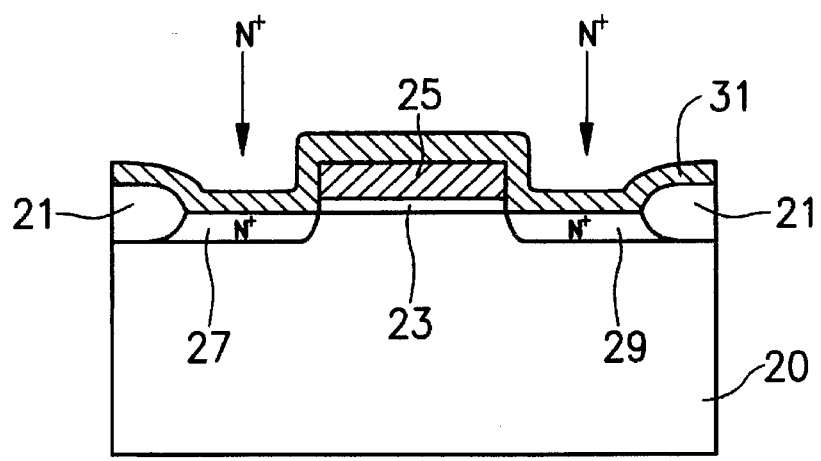
Figure 2C:
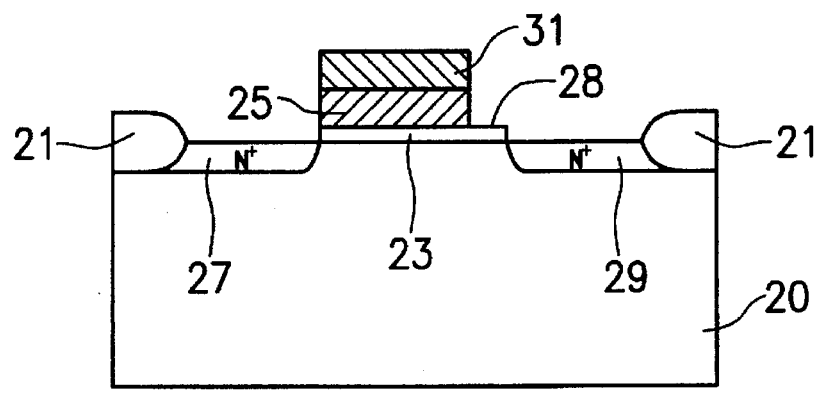

Referring further to FIGS. 2B–2C, the following step can be used in conjunction with a buried contact and high-speed SRAM fabrication process to form a second conductive layer 31 which is subsequently doped with ions to form a heavily doped source 27 and drain 29. A gate is then formed by etching. As shown in FIG. 2B, the second polysilicon layer 31 is deposited to a thickness of about 1000 Å to 2500 Å. After that, an ion implantation process using the insulation layer 23 and the first polysilicon layer 25 as a mask, is performed to implant a source of N-type ions such as phosphor ions with an energy of approximately 30 to 80 KeV and a concentration of approximately $1 \times 10^{15}$ to $1 \times 10^{16}$ atoms/cm$^2$ into the silicon substrate 20. After annealing, the implanted regions are turned into an W-type heavily doped source 27 and drain 29.

Next, as shown in FIG. 2C, a lithographic process using a photoresist layer (not shown) as a mask is performed to selectively etch away part of the first polysilicon layer 25 and the second polysilicon layer 31, thereby forming a gate polysilicon layer and exposing part 28 of the gate oxide layer 23 near the heavily doped drain 29. The exposed part 28 of the gate oxide layer 23 has a width of about 0.05 μm to 0.2 μm. After removing the photoresist layer, the fabrication for the gate is completed.

Figure 2D:
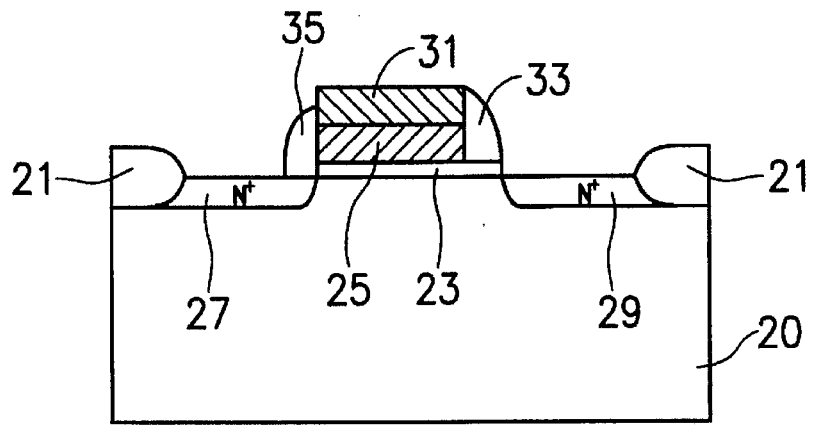

Subsequently, as shown in FIG. 2D, an oxide layer is deposited and then anisotropic etching is used for etchback of that oxide layer so as to form spacers 33, 35 on lateral sides of the first and second polysilicon layers 25, 31. Since the spacer 33 proximate to the heavily doped drain 29 is located on the portion or part 28 of the gate oxide layer 23 not covered by the gate polysilicon layers 25, 31, its bottom does not overlap with the heavily doped drain 29. By contrast, the spacer 35 formed above the heavily doped source 27 has its bottom come into contact with the heavily doped source 27.

3. Forming a lightly doped drain area

Figure 2E:
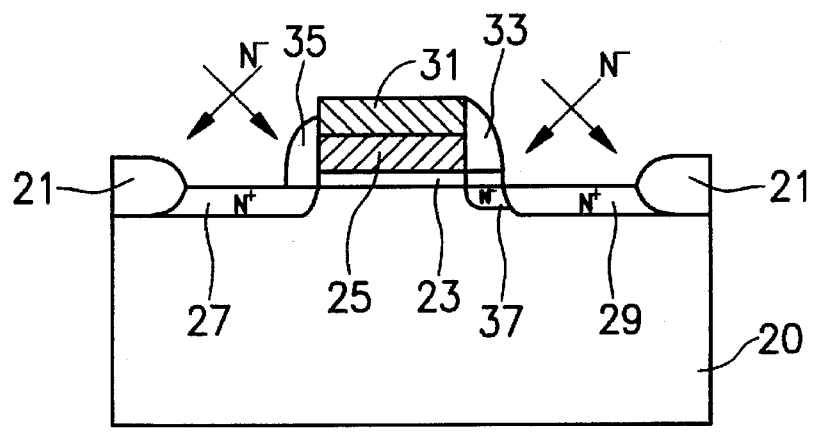

Referring to FIG. 2E, in the next step an ion implantation process is performed to form a lightly doped drain region 37. The ion implantation process utilizes a source of N-type ions such as phosphor ions with an energy of about 30 to 80 KeV and a concentration of about $1 \times 10^{13}$ to $1 \times 10^{14}$ atoms/cm$^2$, and the incident beam of ions is angled by about 20 to 60 degrees with respect to the surface of the silicon substrate 20. Since the phosphor ions are directly implanted into the heavily doped source region 27, which has its bottom overlapped with the spacer 35, no lightly doped source region will be formed. By contrast, in the heavily doped drain region 29, the implantation of phosphor ions allows the forming of a lightly doped drain 37 beneath the portion of the gate oxide layer 23 directly underlying the spacer 33.

Finally, deposition of boron phosphor silicon glass (BPSG), formation of a contact window by heat flow, metallization, and passivation are successively performed to complete the fabrication of the MOS transistor.

Second Embodiment

In the process according to a second embodiment of the invention, the initial steps are the same as those of the first embodiment shown in FIGS. 2A–2C and described in the foregoing. Identical elements are labeled with the same numerals and descriptions thereof will not be repeated herein.

The second embodiment differs from the first in that after the structure shown in FIG. 2C is completed, the gate oxide layer 23, the first polysilicon layer 25, and the second polysilicon layer 31 are used as the gate electrode.

Figure 3:
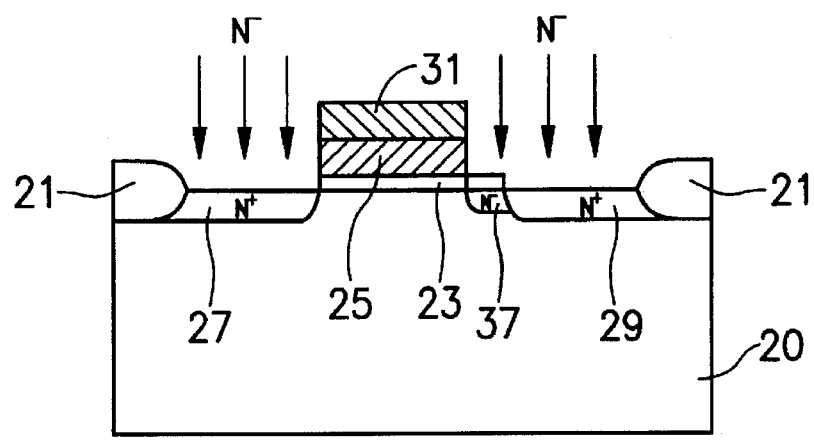
FIGS. 3 is a sectional diagram used to depict the steps involved in a process according to a second embodiment of the invention for fabricating an LDD-based MOS transistor.

As shown in FIG. 3, in the second embodiment there is no need to form the spacers 33, 35 (see FIGS. 2D and 2E) as in the first embodiment. Instead, an ion implantation process is performed while using the first and second polysilicon layers 25, 33 as a mask, to bombard a source of N$^-$-type ions such as phosphor ions with an energy of about 50 to 80 KeV and a concentration of about $1 \times 10^{13}$ to $1 \times 10^{14}$ atoms/cm$^2$. The incident beam of ions is adjusted at approximately a normal angle (90°) with respect to the surface of the silicon substrate 20. Since the phosphor ions are implanted directly into the heavily doped source region 27, no lightly doped source will be produced. By contrast, in the heavily doped drain 29, a lightly doped drain 37 is formed beneath the portion of the gate oxide layer 23 directly underlying the spacer 33.

Finally, deposition of boron phosphor silicon glass (BPSG), forming of a contact window by heat flow, metallization, and passivation are successively performed to complete the fabrication of the MOS transistor.

The LDD-based MOS transistor fabricated according to the invention has several benefits. First, since the deposition of the second polysilicon layer 31 on the lightly doped region utilizes a buried contact process, no additional mask is required and a high speed SRAM fabrication process can be used in conjunction therewith. Second, when the feature size is reduced to a submicron length, the low concentration of the lightly doped drain allows the electric field to be lowered to prevent the generation of hot electrons. Moreover, since the source includes no lightly doped regions:, the resistance thereof will not be increased, thus allowing the channel current in the source region to be operable at low voltages.

The invention has been described above with exemplary embodiments directed to the utilization of N-type source and drain regions. However, it is to be understood that the scope of the invention need not be limited to the disclosed embodiments. Materials, conductive characteristics, parameters, and conditions set for the processes are all subject to other modifications and still lie within the spirit and scope of the invention. Therefore, the invention is intended to cover various modifications and similar arrangements within the scope defined in the following appended claims. The scope of the claims should be accorded the broadest interpretation so as to encompass all such modifications and similar arrangements.

What is claimed is:

1. A process for fabricating an LDD-based MOS transistor, comprising the steps of:

(1) preparing a silicon substrate having a surface with a field oxide layer formed thereon to define an active region;

(2) forming successively a first gate oxide layer and a first polysilicon layer on the silicon substrate;

(3) performing lithographic processes to etch away predetermined portions of the first gate oxide layer and the first polysilicon layer so as to expose areas where heavily doped source/drain regions are to be formed, yielding an etched first gate oxide layer and an etched first polysilicon layer;

(4) forming a second polysilicon layer and then using the etched first gate oxide layer and the etched first polysilicon layer as a mask to perform a first ion implantation process to form the heavily doped source/drain regions;

(5) etching successively the second polysilicon layer and the etched first polysilicon layer so as to form a gate polysilicon layer having lateral sides and so as to expose a part of the gate oxide layer proximate to the heavily doped drain;

(6) depositing a second oxide layer and then performing an anisotropic etching process thereon so as to form a first spacer and a second spacer on lateral sides of the gate polysilicon layer, the first spacer being formed above the part of the gate oxide layer proximate to the heavily doped drain region and the second spacer being formed above the heavily doped source region; and (7) performing a second ion implantation process at a slant angle with respect to the surface of the silicon substrate so as to implant ions respectively into the heavily doped source and drain regions and into an area below the part of the oxide layer underlying the first spacer.

2. A process as claimed in claim 1, wherein said Step (2) comprises forming the first gate oxide layer using chemical-vapor deposition (CVD) to a thickness of about 50 Å to 300 Å by heating the silicon substrate.

3. A process as claimed in claim 1, wherein said Step (2) comprises forming the first gate oxide layer to a thickness of about 50 Å to 300 Å by heating the silicon substrate.

4. A process as claimed in claim 1, wherein said Step (2) comprises forming the first polysilicon layer using low-pressure chemical-vapor deposition to a thickness of about 500 Å to 1500 Å.

5. A process as claimed in claim 1, wherein said Step (4) comprises forming the second polysilicon layer to a thickness of about 1000 Å to 2500 Å.

6. A process as claimed in claim 1, wherein said Step (4) comprises performing the first ion implantation process utilizing a source of phosphor ions with energy of about 30 to 80 KeV and a concentration of about $1\times10^{15}$ to $1\times10^{16}$ atoms/cm$^2$.

7. A process as claimed in claim 1, wherein said Step (5) comprises etching the second polysilicon layer and the first polysilicon layer to expose a part of the gate oxide layer having a width of 0.05 μm to 0.2 μm.

8. A process as claimed in claim 1, wherein said Step (6) comprises performing an anisotropic etching process so as to form a first spacer and a second spacer such that the first spacer is greater in height than the second spacer.

9. A process as claimed in claim 1, wherein said Step (7) comprises performing the second ion implantation process utilizing a source of phosphor ions with energy of about 30 to 80 KeV and a concentration of about $1\times10^{13}$ to $1\times10^{14}$ atoms/cm$^2$ to bombard the surface of the silicon substrate at an angle thereto of about 20 to 60 degrees.

10. A process for fabricating an LDD-based MOS transistor, comprising the steps of:

(1) preparing a silicon substrate having a surface with a field oxide layer formed thereon to define an active region;

(2) forming successively a first gate oxide layer and a first polysilicon layer on the silicon substrate;

(3) performing lithographic processes to etch away predetermined portions of the first gate oxide layer and the first polysilicon layer so as to expose areas where heavily doped source/drain regions are to be formed, yielding an etched first gate oxide layer and an etched first polysilicon layer;

(4) forming a second polysilicon layer and then using the etched first gate oxide layer and the etched first polysilicon layer as a mask to perform a first ion implantation process to form the heavily doped source/drain regions;

(5) etching successively the second polysilicon layer and the etched first polysilicon layer so as to form a gate polysilicon layer having lateral sides and so as to expose a part of the gate oxide layer proximate to the heavily doped drain; and (6) performing a second ion implantation process at approximately a normal angle with respect to the surface of the silicon substrate using the part of the gate oxide layer proximate to the heavily doped drain region and the, gate polysilicon layer as a mask to implant a source of ions respectively into the heavily doped source/drain regions and into an area below said part of the gate oxide layer, thereby forming a lightly doped drain.

11. A process as claimed in claim 10, wherein said Step (2) comprises forming the first gate oxide layer using chemical-vapor deposition (CVD) to a thickness of about 50 Å to 300 Å by heating the silicon substrate.

12. A process as claimed in claim 10, wherein said Step (2) comprises forming the first gate oxide layer to a thickness of about 50 Å to 300 Å by heating the silicon substrate.

13. A process as claimed in claim 10, wherein said Step (2) comprises forming the first polysilicon layer using low-pressure chemical-vapor deposition to a thickness of about 500 Å to 1500 Å.

14. A process as claimed in claim 10, wherein said Step (4) comprises forming the second polysilicon layer to a thickness of about 1000 Å to 2500 Å.

15. A process as claimed in claim 10, wherein said Step (4) comprises performing the first ion implantation process utilizing a source of phosphor ions with energy of about 30 to 80 KeV and a concentration of about $1\times10^{15}$ to $1\times10^{16}$ atoms/cm$^2$.

16. A process as claimed in claim 10, wherein said Step (5) comprises etching the second polysilicon layer and the first polysilicon layer to expose a part of the gate oxide layer having a width of 0.05 μm to 0.2 μm.

17. A process as claimed in claim 10, wherein said Step (6) comprises performing the second ion implantation process utilizing a source of phosphor ions with an energy of about 50 to 80 KeV and a concentration of about $1\times10^{13}$ to $1\times10^{14}$ atoms/cm$^2$.

18. A process for fabricating a transistor, comprising the steps of:

forming a first gate oxide layer and a first polysilicon layer on a surface of a silicon substrate having a field oxide layer;

etching away predetermined portions of the first gate oxide layer and the first polysilicon layer so as to expose areas where heavily doped source and drain regions will be formed, yielding an etched first gate oxide layer and an etched first polysilicon layer;

forming a second polysilicon layer on the etched first polysilicon layer and the areas where heavily doped source and drain regions will be formed;

performing a first ion implantation process using the etched first gate oxide layer and the etched first polysilicon layer as a mask, thereby forming the areas of heavily doped source and drain regions;

depositing a second oxide layer on the etched first polysilicon layer and the areas of heavily doped source and drain regions;

etching the second polysilicon layer and the etched first polysilicon layer so as to form a gate polysilicon layer having lateral sides and so as to expose a part of the gate oxide layer proximate to the heavily doped drain region;

depositing a second oxide layer on the etched first conductive layer, the field oxide layer and the heavily doped source and drain regions;

anisotropically etching the second oxide layer so as to form a first spacer and a second spacer on the lateral sides of the gate polysilicon layer, the first spacer being formed above the part of the gate oxide layer proximate to the heavily doped drain region and the second spacer being formed above the heavily doped source region; and performing a second ion implantation process at a non-normal angle with respect to the surface of the silicon substrate so as to implant ions into the heavily doped source and drain regions and an area approximately underneath the part of the gate oxide layer underlying the first spacer.

19. A process for fabricating a transistor, comprising the steps of:

forming a first gate oxide layer and a first polysilicon layer on a surface of a silicon substrate having a field oxide layer;

etching away predetermined portions of the first gate oxide layer and the first polysilicon layer so as to expose areas where heavily doped source and drain regions will be formed, yielding an etched first gate oxide layer and an etched first polysilicon layer;

forming a second polysilicon layer on the etched first polysilicon layer and the areas where heavily doped source and drain regions will be formed;

performing a first ion implantation process using the etched first gate oxide layer and the etched first polysilicon layer as a mask, thereby forming the areas of heavily doped source and drain regions;

depositing a second oxide layer on the etched first polysilicon layer and the areas of heavily doped source and drain regions;

etching the second polysilicon layer and the etched first polysilicon layer so as to form a gate polysilicon layer having lateral sides and so as to expose a part of the gate oxide layer proximate to the heavily doped drain region;

depositing a second oxide layer on the etched first conductive layer, the field oxide layer and the heavily doped source and drain regions;

etching the second polysilicon layer and the etched first polysilicon layer so as to form a gate polysilicon layer having lateral sides and so as to expose a part of the gate oxide layer proximate to the heavily doped drain region; and performing a second ion implantation process at approximately a normal angle with respect to the surface of the silicon substrate using the part of the gate oxide layer proximate to the heavily doped drain and the gate polysilicon layer as a mask to implant a source of ions into the heavily doped source and drain regions, thereby yielding a lightly doped drain area below said part of the gate oxide layer proximate to the heavily doped drain region.

* * * * *